United States Patent
Yokou et al.

(10) Patent No.: US 9,379,600 B2
(45) Date of Patent: Jun. 28, 2016

(54) SEMICONDUCTOR DEVICE THAT CAN CANCEL NOISE IN BIAS LINE TO WHICH BIAS CURRENT FLOWS

(71) Applicant: PS4 Luxco S.a.r.l., Luxembourg (LU)

(72) Inventors: Hideyuki Yokou, Tokyo (JP); Isao Nakamura, Tokyo (JP); Manabu Ishimatsu, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 59 days.

(21) Appl. No.: 14/174,670

(22) Filed: Feb. 6, 2014

(65) Prior Publication Data

US 2014/0152380 A1    Jun. 5, 2014

Related U.S. Application Data

(63) Continuation of application No. 13/398,711, filed on Feb. 16, 2012, now Pat. No. 8,665,008.

(30) Foreign Application Priority Data

Feb. 22, 2011   (JP) ................................ 2011-036041

(51) Int. Cl.
   *H02M 1/00*     (2006.01)
   *H02M 7/00*     (2006.01)
   *H03K 19/003*   (2006.01)

(52) U.S. Cl.
   CPC ............... *H02M 1/00* (2013.01); *H02M 7/003* (2013.01); *H03K 19/00361* (2013.01)

(58) Field of Classification Search
   CPC .......... H03K 2005/00026; H03K 5/08; H03K 19/00361; H02M 1/00; H02M 7/003
   USPC ......... 327/537, 538, 542, 543, 545, 546, 589, 327/592, 594, 170, 172, 175, 231, 237, 243, 327/244, 250, 251, 261, 262, 264, 265, 276, 327/277, 278, 279, 281, 284, 286, 288, 292
   See application file for complete search history.

(56) References Cited

U.S. PATENT DOCUMENTS

| | | | |
|---|---|---|---|
| 5,489,870 A | 2/1996 | Arakawa | |
| 7,515,080 B2 | 4/2009 | Akizuki et al. | |
| 7,777,663 B2 | 8/2010 | Akizuki et al. | |
| 7,952,408 B2 | 5/2011 | Eisenstadt et al. | |
| 2001/0040473 A1 | 11/2001 | Yoshikawa | |
| 2006/0170460 A1* | 8/2006 | Kawasumi | ...................... 327/52 |
| 2009/0058481 A1 | 3/2009 | Kim et al. | |

FOREIGN PATENT DOCUMENTS

| | | |
|---|---|---|
| JP | 55064437 | 5/1980 |
| JP | 58094232 | 4/1983 |
| JP | 09284125 | 10/1997 |
| JP | 2008-72361 A | 3/2008 |

(Continued)

*Primary Examiner* — Jung Kim

(74) *Attorney, Agent, or Firm* — Kunzler Law Group, PC

(57) ABSTRACT

Disclosed herein is a device that includes a bias line to which a bias current flows, a switch circuit controlling an amount of the bias current based on a control signal, a control line to which the control signal is supplied, and a cancellation circuit substantially cancelling a potential fluctuation of the bias line caused by changing the control signal, the potential fluctuation propagating via a parasitic capacitance between the control line and the bias line.

14 Claims, 6 Drawing Sheets

(56) References Cited

FOREIGN PATENT DOCUMENTS

| | | |
|---|---|---|
| JP | 2009-065633 A | 3/2009 |
| JP | 2009-118049 A | 5/2009 |
| JP | 2010004526 | 7/2010 |

\* cited by examiner

SEMICONDUCTOR DEVICE THAT CAN CANCEL NOISE IN BIAS LINE TO WHICH BIAS CURRENT FLOWS

This Application is a Continuation Application of U.S. patent application Ser. No. 13/398,711, filed on Feb. 16, 2012, which, in turn, claims priority to Japanese Patent Application 2011-036041, filed on Feb. 22, 2011.

BACKGROUND OF THE INVENTION

1. Field of the Invention

The present invention relates to a semiconductor device, and more particularly relates to a semiconductor device capable of switching a bias current flowing along a bias line.

2. Description of Related Art

There are cases that a semiconductor device switches the amount of a bias current flowing along a bias line. As an example, a type of duty-cycle control circuit that controls a duty cycle of a clock signal has a function to change a duty cycle based on a bias current (see Japanese Patent Application Laid-open No. 2009-65633). In such a type of duty-cycle control circuit, a feedback control of changing the amount of the bias current that flows along the bias line in response to the present duty cycle of the clock signal is conducted for the purpose of stabilizing the duty cycle of the clock signal to a desired value (typically, 50%).

However, changing a bias current that flows along a bias line can cause generation of noise on the bias line due to on and off of a switch. In this case, noise is generated whenever the bias current is changed. If such noise is generated in the above-mentioned duty-cycle control circuit which changes a duty cycle based on a bias current, there is a risk that the duty-cycle control circuit cannot stabilize the duty cycle of the clock signal to a desired value.

SUMMARY

In one embodiment, there is provided a semiconductor device that includes: a bias line to which a bias current flows; a switch circuit controlling an amount of the bias current based on a control signal; a control line to which the control signal is supplied; and a cancellation circuit substantially cancelling a potential fluctuation of the bias line caused by changing the control signal, the potential fluctuation propagating via a parasitic capacitance between the control line and the bias line.

In another embodiment, there is provided a semiconductor device that includes: a bias line to which a bias current flows; a switch circuit including a plurality of MOS transistors each having a gate electrode and a drain, each of the gate electrodes having a different width from each other, and the drains being commonly coupled to the bias line; a control circuit supplying each of control signals to the gate electrode of an associated one of the MOS transistors; and a plurality of balance capacities each having a different capacitance from each other, and each having one end being commonly coupled to the bias line and the other end to which an inversion signal of an associated one of the control signals is supplied.

DETAILED DESCRIPTION OF THE EMBODIMENTS

Preferred embodiments of the present invention will be explained below in detail with reference to the accompanying drawings.

Figure 1:
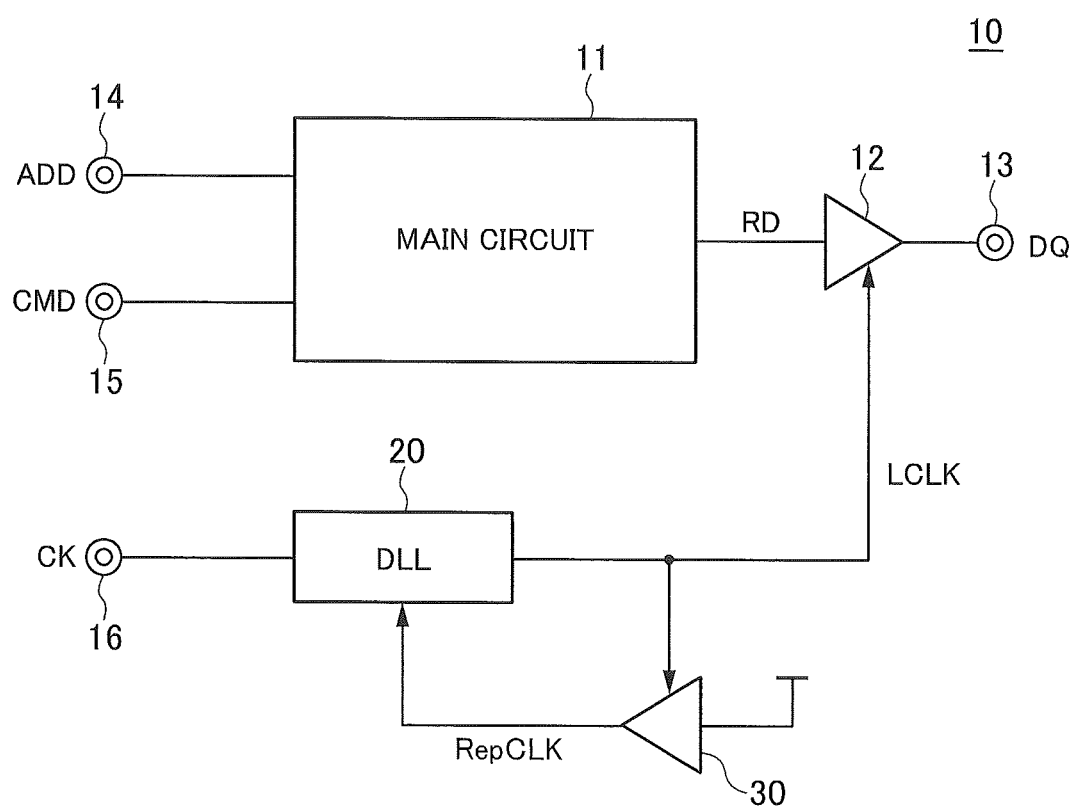
FIG. 1 is a block diagram showing an overall configuration of a semiconductor device 10 according to an embodiment of the present invention.

Referring now to FIG. 1, the semiconductor device 10 according to the present embodiment includes a main circuit 11 and an output buffer 12 that drives a data output terminal 13 based on internal data RD output from the main circuit 11. Although the type of the semiconductor device 10 is not limited to any specific one, the semiconductor device 10 is a DRAM (Dynamic Random Access Memory), for example. When the semiconductor device 10 is a DRAM, the main circuit 11 includes a memory cell array and an access circuit (such as a decoder) for accessing the memory cell array. In this case, an address signal ADD and a command signal CMD are input to the main circuit 11 via an address terminal 14 and a command terminal 15, respectively. When the command signal CMD indicates a read command, data is read from a memory cell specified by the address signal ADD and output as read data DQ from a data output terminal 13. However, the present invention is not limited to DRAMs, but is also applicable to semiconductor memory devices other than DRAMs or semiconductor devices other than semiconductor memory devices.

The output buffer 12 operates synchronously with an internal clock signal LCLK. The internal clock signal LCLK is generated by that a DLL circuit 20 delays an external clock signal CK supplied from outside via a clock terminal 16. The internal clock signal LCLK generated by the DLL circuit 20 is supplied to a replica buffer 30 substantially the same in the circuit configuration as the output buffer 12. An output from the replica buffer 30, that is, a replica clock RepCLK is fed back to the DLL circuit 20. Because the replica buffer 30 is substantially the same in the circuit configuration as the output buffer 12, the phase of the replica clock RepCLK output from the replica buffer 30 accurately matches the phase of the read data DQ output from the output buffer 12. The DLL circuit 20 determines the delay amount in the external clock signal CK upon reception of the replica clock RepCLK, and controls the duty cycle of the internal clock signal LCLK, which is to be output from the DLL circuit 20, to 50%.

Figure 2:
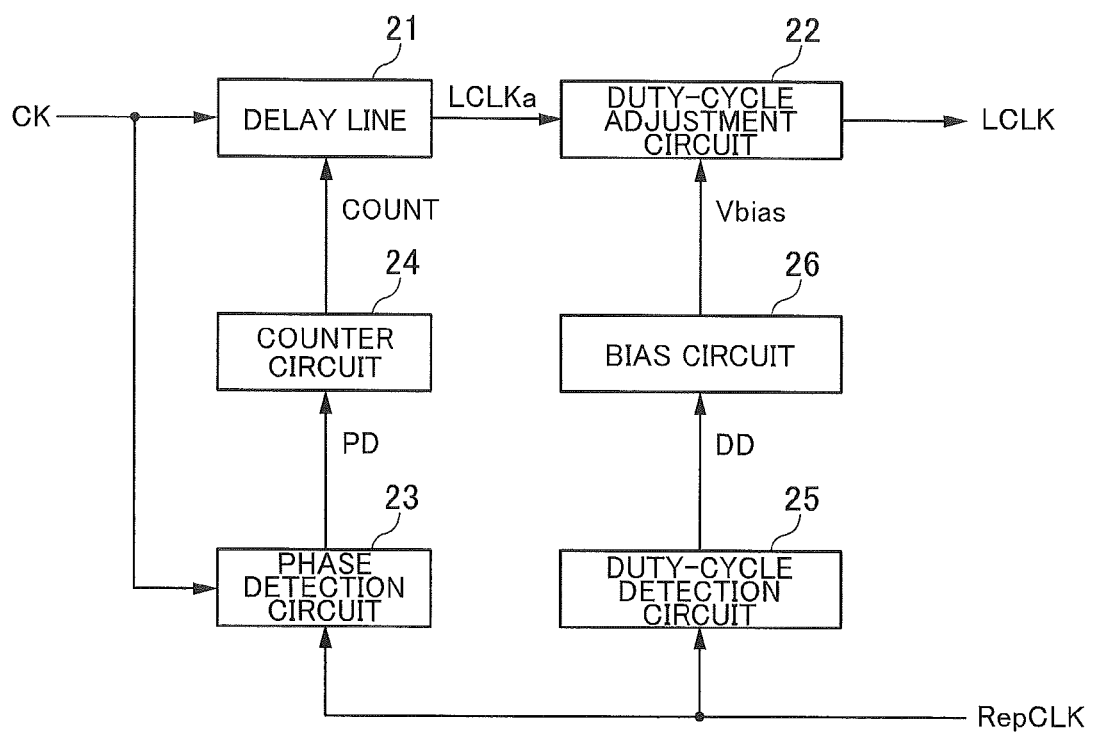
FIG. 2 is a block diagram showing an example of a configuration of the DLL circuit 20 shown in FIG. 1.

Turning to FIG. 2, the DLL circuit 20 includes a delay line 21 that delays the external clock signal CK and a duty-cycle adjustment circuit 22 that adjusts the duty cycle of an internal clock signal LCLKa output from the delay line 21. An output from the duty-cycle adjustment circuit 22 is used as the internal clock signal LCLK. The DLL circuit 20 also includes a phase detection circuit 23, a counter circuit 24, a duty-cycle detection circuit 25, and a bias circuit 26.

The phase detection circuit 23 compares the phase of the external clock signal CK with the phase of the replica clock RepCLK, and generates a phase determination signal PD based on the result of comparison. For example, the phase detection circuit 23 sets the phase determination signal PD to a low level when the phase of the replica clock RepCLK lags behind the phase of the external clock signal CK, and sets it to a high level when the phase of the replica clock RepCLK leads over the phase of the external clock signal CK. The phase detection circuit 23 supplies the phase determination signal PD to the counter circuit 24. The counter circuit 24 counts up or counts down a count value COUNT based on the phase determination signal PD.

The counter circuit 24 supplies the count value COUNT to the delay line 21, and the delay line 21 changes the delay amount in the external clock signal CK based on the count value COUNT. Accordingly, for example, when the phase determination signal PD is at a low level, the counter circuit 24 counts down the count value COUNT, and the delay line 21 reduces the delay amount in the external clock signal CK. As a result, the phase of the replica clock RepCLK is advanced until matching the phase of the external clock signal CK. Conversely, when the phase determination signal PD is a high level, the counter circuit 24 counts up the count value COUNT, and the delay line 21 increases the delay amount in the external clock signal CK. Accordingly, the phase of the replica clock RepCLK is delayed until matching the phase of the external clock signal CK.

Meanwhile, the duty-cycle detection circuit 25 detects the duty cycle of the replica clock RepCLK, and generates a duty-cycle control signal DD based on the result of detection. In the present embodiment, although not limited thereto, the duty-cycle control signal DD is a three-bit binary signal. The duty-cycle detection circuit 25 supplies the duty-cycle control signal DD to the bias circuit 26.

The bias circuit 26 generates a bias voltage Vbias based on the duty-cycle control signal DD. Since the duty-cycle control signal DD is a three-bit binary signal as described above in the present embodiment, the bias circuit 26 changes the level of the bias signal Vbias in eight stages ($=2^3$). The bias circuit 26 is described later in detail. The bias voltage Vbias generated by the bias circuit 26 is supplied to the duty-cycle adjustment circuit 22.

Figure 3:
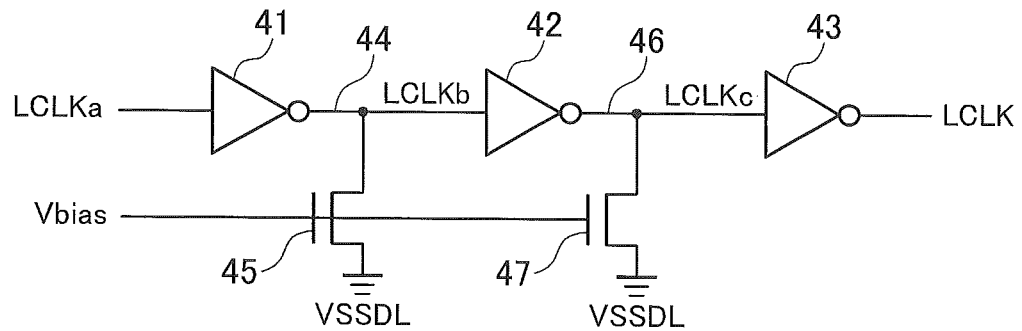
FIG. 3 is a circuit diagram showing an example of the duty-cycle adjustment circuit 22 shown in FIG. 2.

Turning to FIG. 3, the duty-cycle adjustment circuit 22 includes three stages of inverters 41 to 43 connected in series. The internal clock signal LCLKa is supplied to the initial stage inverter 41, and the last stage inverter 43 outputs the internal clock signal LCLK. A bias transistor 45 is connected to a clock transmission line 44 that connects the inverter 41 to the inverter 42, and a bias transistor 47 is connected to a clock transmission line 46 that connects the inverter 42 to the inverter 43. The bias voltage Vbias is supplied to gates of both the bias transistors 45 and 47, and a ground potential VSSDL is supplied to sources thereof. For this reason, transmission characteristics of the clock transmission lines 44 and 46 change according to the bias voltage Vbias.

Figure 4:
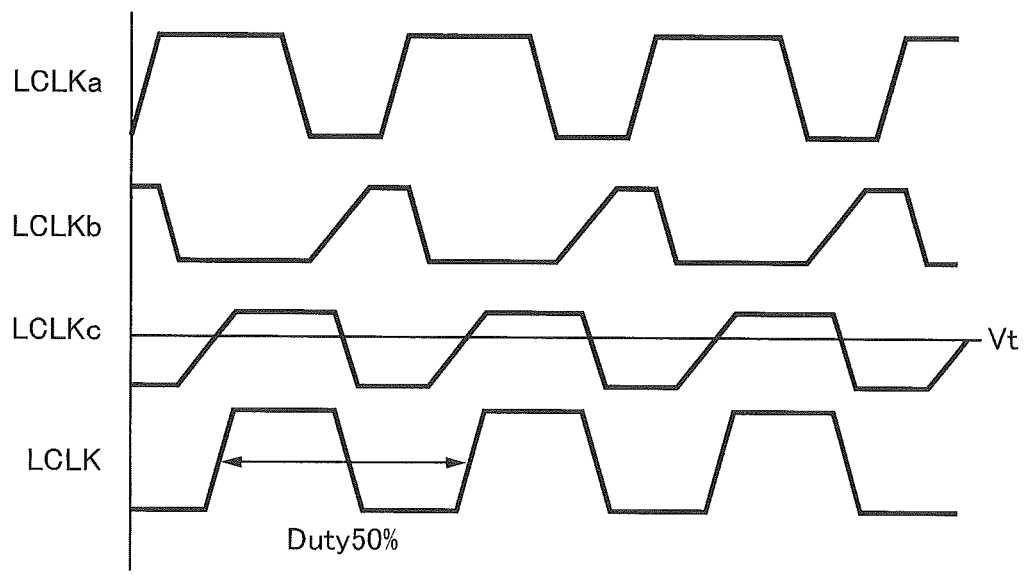
FIG. 4 is a wave form diagram for explaining an operation of the duty-cycle adjustment circuit 22 shown in FIG. 3.

FIG. 4 shows a state where the duty cycle of the internal clock signal LCLKa exceeds 50%. In this case, the level of the bias voltage Vbias is raised. That is, the amount of electric charge extracted by the bias transistors 45 and 47 is increased. As a result, as shown in FIG. 4, the times for rising of the clock signals LCLKb and LCLKc transmitting on the clock transmission lines 44 and 46, respectively, lengthen. The internal clock signal LCLK output from the last stage inverter 43 inverts whenever the clock signal LCLKc on the clock transmission line 46 exceeds a threshold value Vt of the inverter 43. Therefore, the duty cycle of the finally obtained internal clock signal LCLK becomes lower than that of the internal clock signal LCLKa. In this way, the duty cycle of the internal clock signal LCLK is controlled to be 50%.

Figure 5:
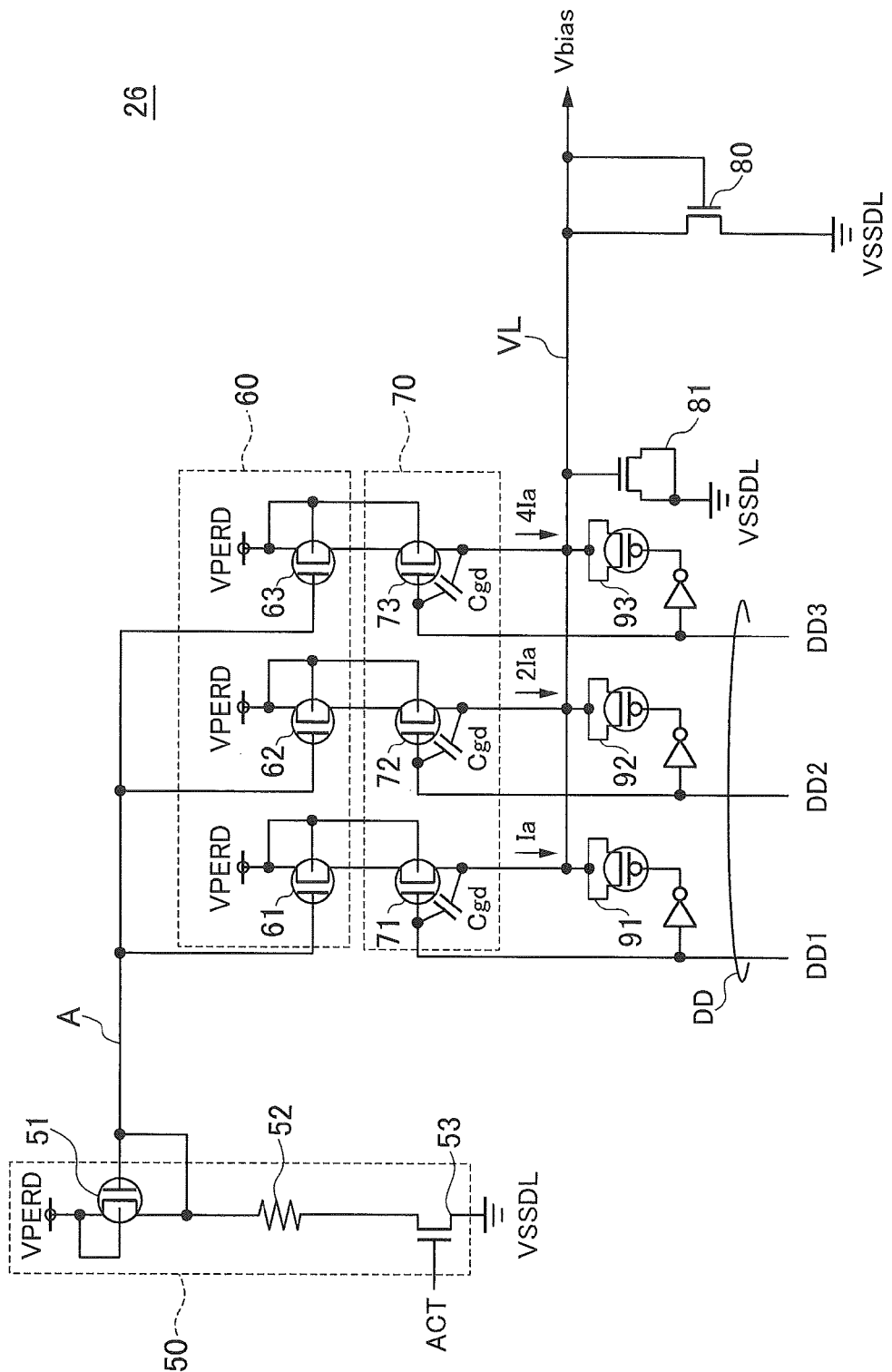
FIG. 5 is a circuit diagram showing an example of the bias circuit 26 shown in FIG. 2.

Turning to FIG. 5, the bias circuit 26 includes a bias source 50 that constitutes an input side of a current mirror circuit, a current source 60 that constitutes an output side of the current mirror circuit, and a switch 70 that is connected between the current source 60 and a bias line VL.

The bias source 50 includes a P-channel MOS transistor 51, a resistor 52, and an N-channel MOS transistor 53 that are connected in series between a power supply potential VPERD and the ground potential VSSDL. A gate and a drain of the transistor 51 are short-circuited to each other, thereby constituting an input transistor of the current mirror circuit. The transistor 53 is provided to activate the bias source 50, and an activation signal ACT is input to a gate of the transistor 53. Therefore, a constant current flows to the bias source 50 in response that the level of the activation signal ACT becomes high, and the potential of a node A becomes equal to a predetermined potential.

The current source 60 includes three P-channel MOS transistors 61 to 63. Sources of the P-channel MOS transistors 61 to 63 are connected to the power supply potential VPERD and gates thereof are connected to the node A. Therefore, the transistors 61 to 63 constitute an output transistor of the current mirror circuit. The transistors 61 to 63 have a different channel width to each other. In the present embodiment, assuming that the channel width of the transistor 61 is Wa, the channel widths of the transistors 62 and 63 are set to 2 Wa and 4 Wa, respectively. Therefore, assuming that a drain current of the transistor 61 is Ia, drain currents of the transistors 62 and 63 are set to 2 Ia and 4 Ia, respectively.

The switch 70 includes three P-channel MOS transistors 71 to 73 connected between the current source 60 and the bias line VL. A source of each of the transistors 71 to 73 is connected to a drain of the corresponding one of the transistors 61 to 63. Three bits DD1 to DD3 that constitute the duty cycle signal DD are supplied to gates of the transistors 71 to 73, respectively. The transistors 71 to 73 are thereby controlled to be turned on or off independently based on the respective bits DD1 to DD3 of the duty-cycle control signal DD. In the present embodiment, the transistors 71 to 73 have a different channel width to each other, similarly to the transistors 61 to 63, so as to reduce ON resistance. Assuming that the channel width of the transistor 71 is Wb, the channel widths of the transistors 72 and 73 are set to 2 Wb and 4 Wb, respectively. The channel width Wb can be set equal to the channel width Wa.

With this configuration, the amount of the bias current flowing from the current source 60 to the bias line VL is controlled on eight stages based on the duty cycle signal DD. As shown in FIG. 5, a current-to-voltage conversion circuit 80 that is constituted by a diode-corrected N-channel MOS transistor is connected to the bias line VL. Accordingly, the potential of the bias line VL becomes a level according to the amount of the bias current flowing into the bias line VL, that is, the value of the duty cycle signal DD.

Furthermore, in the present embodiment, balance capacities 91 to 93 are connected to the bias line VL. The balance capacities 91 to 93 are constituted by P-channel MOS transistors each having a source short-circuited to a drain. The sources and drains of the transistors are connected to the bias line VL, and inversion signals of the three bits DD1 to DD3 constituting the duty-cycle control signal DD are supplied to gates of the transistors, respectively. In the present embodiment, the transistors constituting the respective balance capacities 91 to 93 have also a different channel width to each other. Assuming that the channel width of the transistor that constitutes the balance capacity 91 is Wc, the channel widths of the transistors that constitute the balance capacities 92 and 93 are set to 2 Wc and 4 Wc, respectively. The channel width Wc is preferably half the channel width Wb.

The balance capacities 91 to 93 act as cancellers of noise which is generated in the bias line VL when the transistors 71 to 73 constituting the switch 70 change from an ON-state to an OFF-state or from an OFF-state to an ON-state.

That is, when a logic level of the bits DD1 to DD3 constituting the duty-cycle control signal DD changes, the noise resulting from the parasitic capacitances between control lines for transmitting the respective bits DD1 to DD3 and the bias line VL are superimposed on the bias line VL. These parasitic capacitances mainly consist of parasitic capacitances Cgd between the gates and drains of the transistors 71 to 73. For example, when the bit DD1 changes from a low level to a high level, the parasitic capacitance Cgd included in the transistor 71 instantaneously increases the level of the bias line VL. Conversely, when the bit DD1 changes from a high level to a low level, the level of the bias line VL instantaneously drops. To design a compensation capacitance 81 to have a large capacitance can curtail such noise to some extent. However, this delays the change in the bias voltage Vbias in response to the change in the duty cycle signal DD.

The balance capacities 91 to 93 solve the above problems. That is, the inversion signals of the bits DD1 to DD3 are supplied to the balance capacities 91 to 93, respectively. Therefore, the noise superimposed on the bias line VL via the transistors 71 to 73 because of changes in the bits DD1 to DD3 is cancelled by noise superimposed on the bias line VL via the balance capacities 91 to 93 because of the changes in the bits DD1 to DD3. For example, when the bit DD1 changes from a low level to a high level, the noise via the transistor 71 is supposed to instantaneously increase the level of the bias line VL. At the same time, however, the noise via the balance capacitance 91 instantaneously drops the level of the bias line VL. As a consequence, no noise is generated in the bias voltage. In this way, the balance capacities 91 to 93 function as cancellation circuits that cancel a potential fluctuation in the bias line VL generated when the duty-cycle control signal DD changes.

Furthermore, the noise can be cancelled almost completely with designing the channel width Wc to be half of the channel width Wb as described above. The reason is as follows: The noise via the transistors 71 to 73 derives from the parasitic capacitances Cgd between the gates and drains of the transistors 71 to 73. On the other hand, the noise via the balance capacities 91 to 93 derives from both the parasitic capacitances between the gates and drains of the transistors 71 to 73 and parasitic capacitances between the gates and sources thereof. Therefore, if the channel widths are equally set to the transistors 71 to 73 and the balance capacities 91 to 93, the balance capacities 91 to 93 will have the capacitances twice as large as those of the transistors 71 to 73. But, in the present embodiment, the channel widths of the transistors constituting the respective balance capacities 91 to 93 are set half as large as the channel widths of the transistors 71 to 73. Therefore the noise can be completely cancelled. It should be noted that the above descriptions have been given on the premise that the channel widths of the respective transistors are constant. When the channel widths are considered to change, "gate areas" can replace the "channel widths".

Figure 6:
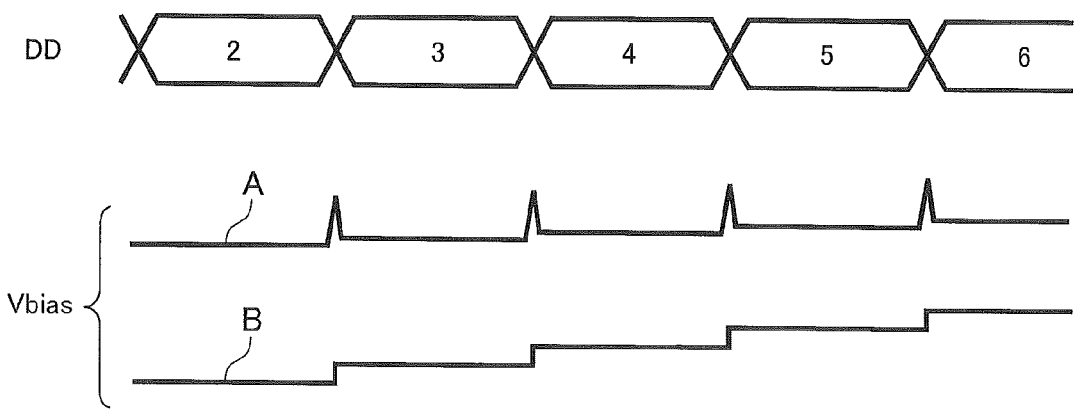
FIG. 6 is a waveform diagram for schematically explaining an operation of the bias circuit 26 shown in FIG. 5.

As indicated by a waveform A in FIG. 6 which represents a comparative example in which the bias circuit 26 does not employ the balance capacities 91 to 93, large noise is superimposed on the bias voltage Vbias before and after the changes in the duty-cycle control signal DD 2, 3, 4, 5, and onwards). Particularly in the duty-cycle adjustment circuit 22 shown in FIG. 3, the bias line VL is directly connected to gates of the bias transistors 45 and 47. Therefore, the noise superimposed on the bias voltage Vbias directly influences the bias transistors 45 and 47. This possibly prevents the duty-cycle adjustment circuit 22 from adjusting the duty cycle of the internal clock signal LCLK to the desired value.

On the other hand, in the present embodiment, as indicated by a waveform B in FIG. 6, the level of the bias voltage Vbis normally changes when the duty-cycle control signal DD changes, and no noise is generated before and after the change. This makes the amount of the electric charge extracted by the bias transistors 45 and 47 equal to a desired amount. And thus it becomes possible for the duty-cycle adjustment circuit 22 to adjust the duty cycle of the internal clock signal LCLK to the desired value (typically, 50%). In this way, according to the present embodiment, the bias circuit 26 can cancel the noise on the bias line VL and it becomes possible for the duty-cycle adjustment circuit 22 to adjust the duty cycle to the desired value, despite the gates of the bias transistors 45 and 47 to be controlled are directly connected to the bias line VL, and for that reason, the noise superimposed on the bias line VL has a great effect on the duty cycle.

The embodiment of applying the present invention to the bias circuit 26 that controls the duty-cycle adjustment circuit 22 has been described above. However, the applicable range of the present invention is not limited thereto. For example, the present invention can be also applied to the delay line 21.

Figure 7:
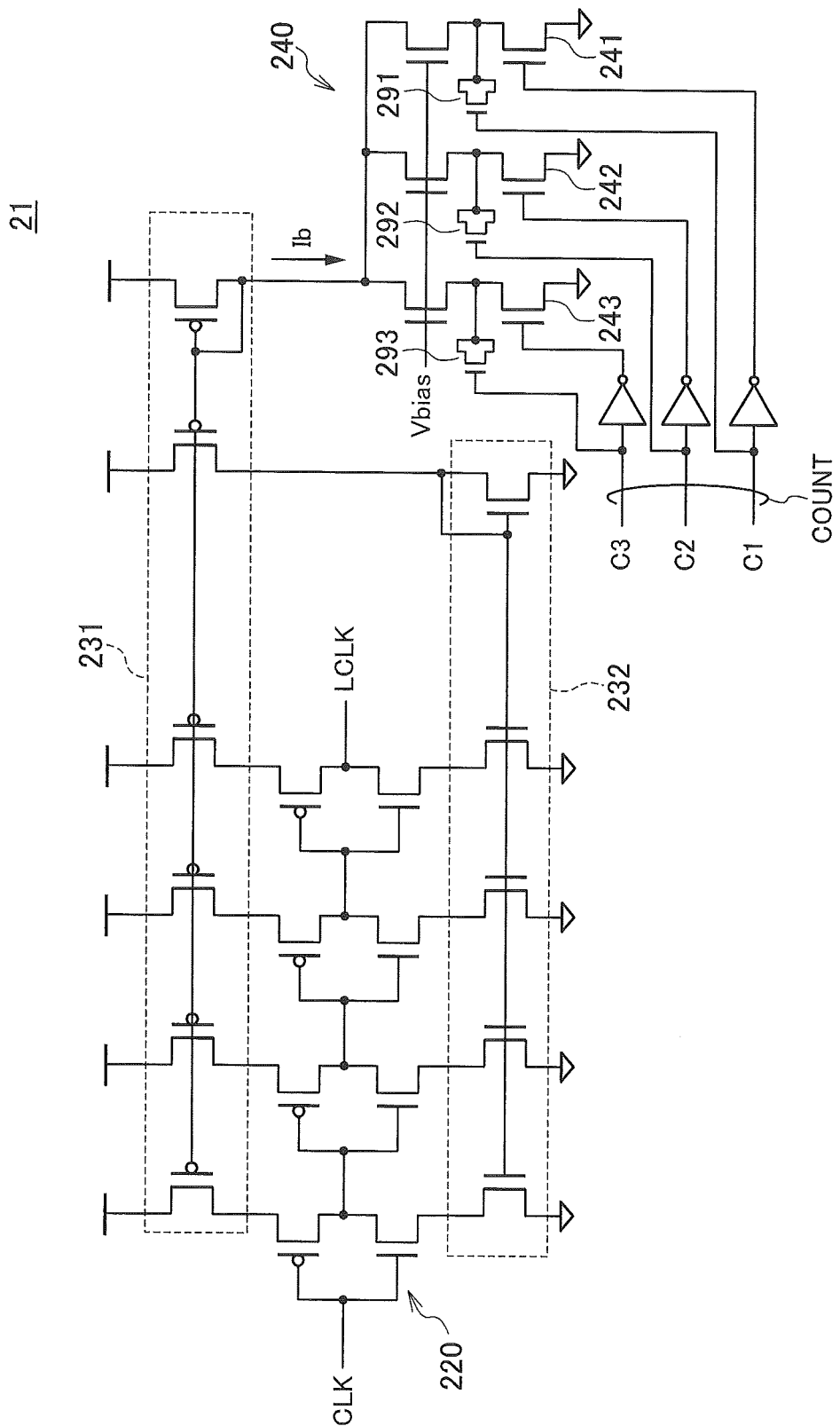
FIG. 7 is a circuit diagram of the delay line 21 shown in FIG. 2.

Turning to FIG. 7, the delay line 21 includes an inverter array 220 of a plurality of inverters (in this example, four stages), a constant current circuit 231 that applies an operating current to sources of P-channel MOS transistors constituting the inverter array 220, a constant current circuit 232 that applies an operating current to sources of N-channel MOS transistors constituting the inverter array 220, and a current adjustment circuit 240 that determines a current Ib of the constant current circuits 231 and 232.

The current adjustment circuit 240 includes three select transistors 241 to 243 connected in parallel. The select transistors 241 to 243 have weighted current supply capabilities. Assuming that the channel width of the select transistor 241 is Wd, the channel width of the select transistors 242 and 243 are designed to 2 Wd and 4 Wd, respectively. Furthermore, inversion signals of three bits C1 to C3 that constitute the count value COUNT of the counter circuit 24 are supplied to gates of the select transistors 241 to 243, respectively. The current adjustment circuit 240 thereby selects one of eight current values based on the three-bit count value COUNT.

The current Ib generated by the current adjustment circuit 240 based on the count value COUNT is copied by current mirror circuits included in the constant current circuits 231 and 232, and applied to the inverter array 220 as an operating current. The operating current changes transmission characteristics of the inverter array 220 that determine delay amounts. Therefore, the count value COUNT can control the phase of the internal clock signal LCLK.

Furthermore, in the present embodiment, balance capacities 291 to 293 are connected to drains of the select transistors 241 to 243, respectively, and the three bits C1 to C3 that constitute the count value COUNT are supplied to gates of transistors that constitute the respective balance capacities 291 to 293. Channel widths of the transistors that constitute the balance capacities 291 to 293 are preferably Wd/2, Wd, and 2 Wd, respectively for the same reason as that described above. By configuring the delay line 21 in this manner, the noise generated by the changes in the count value COUNT is cancelled by the balance capacities 291 to 293.

Therefore, the phase of the internal clock signal LCLK can be accurately controlled.

It is apparent that the present invention is not limited to the above embodiments, but may be modified and changed without departing from the scope and spirit of the invention.

For example, in the above embodiment, both the duty-cycle control signal DD and the count value COUNT are three-bit signals. However, the numbers of bits of these signals are not limited to three.

Furthermore, in the above embodiment, MOS transistors each having a source short-circuited to a drain are used as the balance capacities. However, the use of such MOS transistors is not essential in the present invention. Further, even when the MOS transistors each having a source short-circuited to a drain are used as the balance capacities, inputting of signals to gates of the MOS transistors and connection of sources and drains to the bias line are not essential in the present invention and vice versa.

What is claimed is:

1. A method comprising:
supplying a first control signal to a first control line;
supplying a second control signal to a second control line;
controlling an amount of a bias current flowing to a bias line based on the first control signal and the second control signal, a first parasitic capacitance being formed between the first control line and the bias line and a second parasitic capacitance being formed between the second control line and the bias line;
changing at least one of the first control signal and the second control signal;
supplying an inversion signal of the first control signal to a first balance capacitor that includes one end coupled to the bias line and another end that receives the inversion signal of the first control signal;
substantially cancelling a potential fluctuation of the bias line caused by the changing of the at least one of the first control signal and the second control signal, wherein the potential fluctuation propagates via at least one of the first parasitic capacitance and the second parasitic capacitance corresponding to the at least one of the first control signal and the second control signal, and wherein a magnitude of the bias current or a level of a bias voltage into which the bias current is converted is a control parameter of a circuit to be controlled;
converting the bias current into the bias voltage; and
supplying the bias voltage to a control electrode of a bias transistor, wherein the bias transistor is coupled to a clock transmission line so that transmission characteristics of the clock transmission line are controlled based on the bias voltage.

2. The method as claimed in claim 1, further comprising transmitting a clock signal on the clock transmission line.

3. A method comprising:
supplying a first control signal to a first control line;
supplying a second control signal to a second control line;
controlling an amount of a bias current flowing to a bias line based on the first control signal and the second control signal, a first parasitic capacitance being formed between the first control line and the bias line and a second parasitic capacitance being formed between the second control line and the bias line;
changing at least one of the first control signal and the second control signal;
supplying an inversion signal of the first control signal to a first balance capacitor that includes one end coupled to the bias line and another end that receives the inversion signal of the first control signal;
substantially cancelling a potential fluctuation of the bias line caused by the changing of the at least one of the first control signal and the second control signal, wherein the potential fluctuation propagates via at least one of the first parasitic capacitance and the second parasitic capacitance corresponding to the at least one of the first control signal and the second control signal, and wherein a magnitude of the bias current or a level of a bias voltage into which the bias current is converted is a control parameter of a circuit to be controlled;
converting the bias current into the bias voltage; and
supplying the bias voltage to a control electrode of a bias transistor, wherein the bias transistor is inserted between an inverter array and a power supply line so that transmission characteristics of the inverter array are controlled based on the bias voltage.

4. The method as claimed in claim 3, wherein the power supply line provides an operating voltage for a delay locked loop.

5. The method as claimed in claim 3, further comprising transmitting a clock signal from the inverter array.

6. A semiconductor device comprising:
a bias line to which a bias current flows;
a control unit configured to control an amount of the bias current based on a first control signal and a second control signal;
a first control line to which the first control signal is supplied, a first parasitic capacitance being formed between the first control line and the bias line;
a second control line to which the second control signal is supplied, a second parasitic capacitance being formed between the second control line and the bias line;
a cancel circuit configured to substantially cancel a potential fluctuation of the bias line caused by the changing of at least one of the first control signal and the second control signal, wherein the potential fluctuation propagates via at least one of the first parasitic capacitance and the second parasitic capacitance corresponding to the at least one of the first control signal and the second control signal, wherein a magnitude of the bias current or a level of a bias voltage into which the bias current is converted is a control parameter of a circuit to be controlled, and wherein the cancel circuit includes a first balance capacitor that includes one end coupled to the bias line and another end for receiving an inversion signal of the first control signal;
a current-to-voltage conversion circuit configured to convert the bias current into the bias voltage; and
a bias transistor that includes a control electrode to which the bias voltage is applied, wherein the bias transistor is coupled to a clock transmission line so that transmission characteristics of the clock transmission line are controlled based on the bias voltage.

7. The semiconductor device as claimed in claim 6, wherein the clock transmission line transmits a clock signal.

8. A semiconductor device comprising:
a bias line to which a bias current flows;
a control unit configured to control an amount of the bias current based on a first control signal and a second control signal;
a first control line to which the first control signal is supplied, a first parasitic capacitance being formed between the first control line and the bias line;
a second control line to which the second control signal is supplied, a second parasitic capacitance being formed between the second control line and the bias line;
a cancel circuit configured to substantially cancel a potential fluctuation of the bias line caused by the changing of at least one of the first control signal and the second control signal, wherein the potential fluctuation propagates via at least one of the first parasitic capacitance and the second parasitic capacitance corresponding to the at least one of the first control signal and the second control signal, wherein a magnitude of the bias current or a level of a bias voltage into which the bias current is converted is a control parameter of a circuit to be controlled, and wherein the cancel circuit includes a first balance capacitor that includes one end coupled to the bias line and another end for receiving an inversion signal of the first control signal;

a current-to-voltage conversion circuit configured to convert the bias current into the bias voltage; and a bias transistor that includes a control electrode to which the bias voltage is applied, wherein the bias transistor is inserted between an inverter array and a power supply line so that transmission characteristics of the inverter array are controlled based on the bias voltage.

9. The semiconductor device as claimed in claim 8, wherein the power supply line provides an operating voltage for a delay locked loop.

10. The semiconductor device as claimed in claim 8, wherein the inverter array transmits a clock signal.

11. The semiconductor device as claimed in claim 6, wherein the first balance capacitor comprises a first transistor, wherein the another end of the first balance capacitor that receives the inversion signal of the first control signal is a control electrode of the first transistor, and wherein the end of the first balance capacitor coupled to the bias line comprises a node at which a source terminal and a drain terminal of the first transistor are short circuited.

12. A semiconductor device comprising:
a bias line to which a bias current flows;
a control unit configured to control an amount of the bias current based on a first control signal and a second control signal;
a first control line to which the first control signal is supplied, a first parasitic capacitance being formed between the first control line and the bias line;
a second control line to which the second control signal is supplied, a second parasitic capacitance being formed between the second control line and the bias line;
a cancel circuit configured to substantially cancel a potential fluctuation of the bias line caused by the changing of at least one of the first control signal and the second control signal, wherein the potential fluctuation propagates via at least one of the first parasitic capacitance and the second parasitic capacitance corresponding to the at least one of the first control signal and the second control signal, wherein a magnitude of the bias current or a level of a bias voltage into which the bias current is converted is a control parameter of a circuit to be controlled, and wherein the cancel circuit includes a first balance capacitor that includes one end coupled to the bias line and another end for receiving an inversion signal of the first control signal, wherein the cancel circuit includes a second balance capacitor that includes one end coupled to the bias line and another end for receiving an inversion signal of the second control signal.

13. The semiconductor device as claimed in claim 12, wherein the second balance capacitor comprises a second transistor, wherein the another end of the second balance capacitor that receives the inversion signal of the second control signal is a control electrode of the second transistor, and wherein the end of the second balance capacitor coupled to the bias line comprises a node at which a source terminal and a drain terminal of the second transistor are short circuited.

14. The method as claimed in claim 1, wherein the first balance capacitor includes a first transistor, wherein the another end of the first balance capacitor that receives the inversion signal of the first control signal is a control electrode of the first transistor, and wherein the end of the first balance capacitor coupled to the bias line comprises a node at which a source terminal and a drain terminal of the first transistor are short circuited.

* * * * *